US011245379B2

(12) United States Patent
Konoma

(10) Patent No.: US 11,245,379 B2
(45) Date of Patent: Feb. 8, 2022

(54) ELASTIC WAVE DEVICE

(71) Applicant: Murata Manufacturing Co., Ltd., Nagaokakyo (JP)

(72) Inventor: Chihiro Konoma, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 734 days.

(21) Appl. No.: 15/834,193

(22) Filed: Dec. 7, 2017

(65) Prior Publication Data
US 2018/0102756 A1 Apr. 12, 2018

Related U.S. Application Data

(63) Continuation of application No. PCT/JP2016/066249, filed on Jun. 1, 2019.

(30) Foreign Application Priority Data

Jul. 17, 2015 (JP) .............................. JP2015-142973

(51) Int. Cl.
*H03H 9/02* (2006.01)
*H03H 9/145* (2006.01)
(Continued)

(52) U.S. Cl.
CPC ..... *H03H 9/02984* (2013.01); *H01L 41/0477* (2013.01); *H03H 9/02559* (2013.01);
(Continued)

(58) Field of Classification Search
CPC ........... H03H 9/02984; H03H 9/02559; H03H 9/02834; H03H 9/02937; H03H 9/02535; H01L 41/047; H01L 41/0477
(Continued)

(56) References Cited

U.S. PATENT DOCUMENTS

2002/0195675 A1* 12/2002 Hakamada ......... H03H 9/14541
257/416
2003/0146674 A1 8/2003 Jacot et al.
(Continued)

FOREIGN PATENT DOCUMENTS

JP 05-22067 A 1/1993
JP 10-135766 A 5/1998
(Continued)

OTHER PUBLICATIONS

Official Communication issued in International Patent Application No. PCT/JP2016/066249, dated Aug. 23, 2016.

*Primary Examiner* — Derek J Rosenau
(74) *Attorney, Agent, or Firm* — Keating & Bennett, LLP

(57) ABSTRACT

In an elastic wave device, an IDT electrode is disposed on a piezoelectric substrate and includes a close contact layer, which includes first and second main surfaces and side surfaces. The first main surface is in contact with the piezoelectric substrate, and at least two electrode layers are disposed on the close contact layer. The at least two electrode layers include a first electrode layer and a second electrode layer. The first electrode layer is made of a material that has a higher density than that of Al. The second electrode layer has a lower density than the first electrode layer. One of the at least two electrode layers has higher weather resistance than the close contact layer and covers the side surfaces of the close contact layer.

17 Claims, 6 Drawing Sheets

(51) Int. Cl.
*H01L 41/047* (2006.01)
*H03H 9/25* (2006.01)

(52) U.S. Cl.
CPC .... *H03H 9/02834* (2013.01); *H03H 9/02937* (2013.01); *H03H 9/145* (2013.01); *H03H 9/14541* (2013.01); *H03H 9/25* (2013.01)

(58) Field of Classification Search
USPC .......... 310/313 A, 313 B, 313 C, 313 D, 364
See application file for complete search history.

(56) References Cited

U.S. PATENT DOCUMENTS

| | | |
|---|---|---|
| 2006/0175639 A1 | 8/2006 | Leidl et al. |
| 2009/0121584 A1 | 5/2009 | Nishimura et al. |
| 2011/0156531 A1 | 6/2011 | Tamazaki et al. |
| 2012/0133246 A1* | 5/2012 | Yaoi ................ H01L 41/047 310/313 C |
| 2012/0274179 A1 | 11/2012 | Nodake et al. |

FOREIGN PATENT DOCUMENTS

| | | | |
|---|---|---|---|
| JP | 2001-217672 A | 8/2001 | |
| JP | 2001-230648 A | 8/2001 | |
| JP | 2005-516517 A | 6/2005 | |
| JP | 2005-518127 A | 6/2005 | |
| JP | 2011-135469 A | 7/2011 | |
| JP | 2012-034418 A | 2/2012 | |
| JP | 2012-186696 A | 9/2012 | |
| WO | 2010/122993 A1 | 10/2010 | |

\* cited by examiner

ELASTIC WAVE DEVICE

CROSS REFERENCE TO RELATED APPLICATIONS

This application claims the benefit of priority to Japanese Patent Application No. 2015-142973 filed on Jul. 17, 2015 and is a Continuation Application of PCT Application No. PCT/JP2016/066249 filed on Jun. 1, 2016. The entire contents of each application are hereby incorporated herein by reference.

BACKGROUND OF THE INVENTION

1. Field of the Invention

The present invention relates to an elastic wave device that includes an IDT electrode on a piezoelectric substrate, the IDT electrode including a stack of metal layers.

2. Description of the Related Art

In an elastic wave device described in Japanese Unexamined Patent Application Publication No. 2011-135469, an IDT electrode includes stacked metal films. These stacked metal films are formed on a $LiNbO_3$ substrate. In such stacked metal films, each metal film is stacked in an order of NiCr (close contact layer)/Pt (first electrode layer that has a higher density than that of Al)/Ti (diffusion preventing layer)/AlCu (second electrode layer that has a lower density than that of the first electrode layer) from the $LiNbO_3$ substrate.

The elastic wave device described in Japanese Unexamined Patent Application Publication No. 2011-135469 includes the NiCr film as the close contact layer to adhere the IDT electrode to the piezoelectric substrate made of $LiNbO_3$ and the like. However, the NiCr film defining the close contact layer does not have sufficient weather resistance. Therefore, the NiCr film defining the close contact layer is likely to corrode due to, for example, humidity. As a result, electrical characteristics of the close contact layer degrade. In addition, the degraded electrical characteristics of the close contact layer may destroy the IDT electrode.

SUMMARY OF THE INVENTION

Preferred embodiments of the present invention provide elastic wave devices that have a structure in which a close contact layer, a first electrode layer, a diffusion preventing layer, and a second electrode layer are stacked, and that achieve excellent weather resistance.

An elastic wave device according to a preferred embodiment of the present invention includes a piezoelectric substrate including a first main surface and a second main surface and an IDT electrode disposed on the piezoelectric substrate. The IDT electrode includes a close contact layer disposed in contact with the first main surface of the piezoelectric substrate and at least two electrode layers disposed on the close contact layer. The at least two electrode layers include a first electrode layer that is disposed on the close contact layer and has a higher density than that of Al and a second electrode layer that is disposed on the first electrode layer and has a lower density than that of the first electrode layer. One of the at least two electrode layers has higher weather resistance than the close contact layer and is disposed so as to cover side surfaces of the close contact layer.

In an elastic wave device according to a preferred embodiment of the present invention, the first electrode layer covers the side surfaces of the close contact layer.

In an elastic wave device according to a preferred embodiment of the present invention, the IDT electrode further includes a third electrode layer disposed between the close contact layer and the first electrode layer, and the first electrode layer covers the side surfaces of the close contact layer and side surfaces of the third electrode layer.

In an elastic wave device according to a preferred embodiment of the present invention, the IDT electrode further includes a third electrode layer disposed between the close contact layer and the first electrode layer, and the third electrode layer covers the side surfaces of the close contact layer.

In an elastic wave device according to a preferred embodiment of the present invention, side surfaces of the first electrode layer are inclined so as to get closer to a center of the first electrode layer from a close-contact-layer side towards a second-electrode-layer side. In this case, when a dielectric layer is disposed so as to cover the IDT electrode, a space is unlikely to be present between the dielectric layer and the IDT electrode.

In an elastic wave device according to a preferred embodiment of the present invention, side surfaces of the third electrode layer are inclined so as to get closer to a center of the third electrode layer from a close-contact-layer side towards a second-electrode-layer side.

In an elastic wave device according to a preferred embodiment of the present invention, the elastic wave device further includes a dielectric layer disposed on the piezoelectric substrate so as to cover the IDT electrode. This configuration further improves weather resistance.

In an elastic wave device according to a preferred embodiment of the present invention, the side surfaces of the close contact layer are inclined so as to get closer to a center of the close contact layer from the piezoelectric substrate toward an electrode-layer side, the electrode layer covering the side surfaces of the close contact layer.

In an elastic wave device according to a preferred embodiment of the present invention, the close contact layer is thinner than the first and second electrode layers.

In an elastic wave device according to a preferred embodiment of the present invention, the elastic wave device includes a diffusion preventing layer that is disposed between the first electrode layer and the second electrode layer and prevents metal diffusion between the first electrode layer and the second electrode layer.

In an elastic wave device according to a preferred embodiment of the present invention, the diffusion preventing layer is thinner than the first and second electrode layers.

In an elastic wave device according to a preferred embodiment of the present invention, the dielectric layer is made of silicon oxide. This improves frequency temperature characteristics of the elastic wave device.

In an elastic wave device according to a preferred embodiment of the present invention, the close contact layer includes a metal layer made of NiCr or Ti. This further effectively increases adhesion of the IDT electrode to the piezoelectric substrate.

In an elastic wave device according to a preferred embodiment of the present invention, the second electrode layer is made of Al or an Al alloy. This effectively decreases electrical resistance of the IDT electrode.

In an elastic wave device according to a preferred embodiment of the present invention, the first electrode layer is made of a single metal selected from the group consisting of Pt, Cu, Au, and Mo or an alloy containing the metal as a main component. This sufficiently increases a response of a Rayleigh wave.

In an elastic wave device according to a preferred embodiment of the present invention, having higher weather resistance means having a lower ionization tendency or having improved corrosion resistance due to metal passivation.

According to various preferred embodiments of the present invention, the weather resistance of the elastic wave device is effectively improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, with reference to the attached drawings, specific preferred embodiments of the present invention will be described to disclose the present invention.

Each preferred embodiment described in the present specification is illustrative, and it should be noted that components of different preferred embodiments may be partially replaced and combined.

Figure 2:
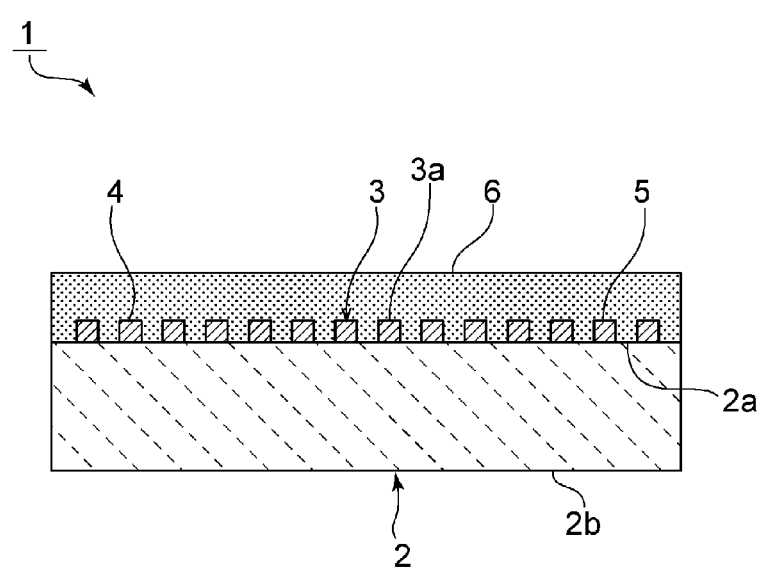
FIG. 2 is an elevational cross-sectional view of the elastic wave device according to the first preferred embodiment of the present invention.

FIG. 2 is an elevational cross-sectional view of an elastic wave device according to a first preferred embodiment of the present invention. An elastic wave device 1 includes a piezoelectric substrate 2. The piezoelectric substrate 2 is preferably made of $LiNbO_3$, for example. The piezoelectric substrate 2 may be made of other piezoelectric single crystals, such as $LiTaO_3$, or other piezoelectric materials, such as piezoelectric ceramics, for example.

The piezoelectric substrate 2 includes a first main surface 2a that defines an electrode surface and a second main surface 2b opposing the first main surface 2a. An IDT electrode 3 and reflectors 4 and 5 are disposed on the first main surface 2a preferably to define a one-port elastic wave resonator, for example. However, the electrode structure of the elastic wave device 1 is not limited to a structure defining an elastic wave resonator. Various kinds of electrode structures defining an elastic wave device, such as an elastic wave filter, may be used. Any electrode structure may be used provided that it includes at least one IDT electrode.

On the piezoelectric substrate 2, a dielectric layer 6 preferably made of a silicon oxide film, for example, is disposed so as to cover the IDT electrode 3 and the reflectors 4 and 5. Since the dielectric layer is preferably made of silicon oxide, an absolute value of the temperature coefficient of resonant frequency TCF is able to be reduced in the elastic wave device 1, in other words, frequency temperature characteristics are able to be improved. Examples of the material of the dielectric layer 6 include appropriate inorganic dielectric materials, such as silicon nitrides, silicon oxynitrides, and alumina, as well as silicon oxides. Providing the dielectric layer 6 further improves weather resistance.

Figure 1:
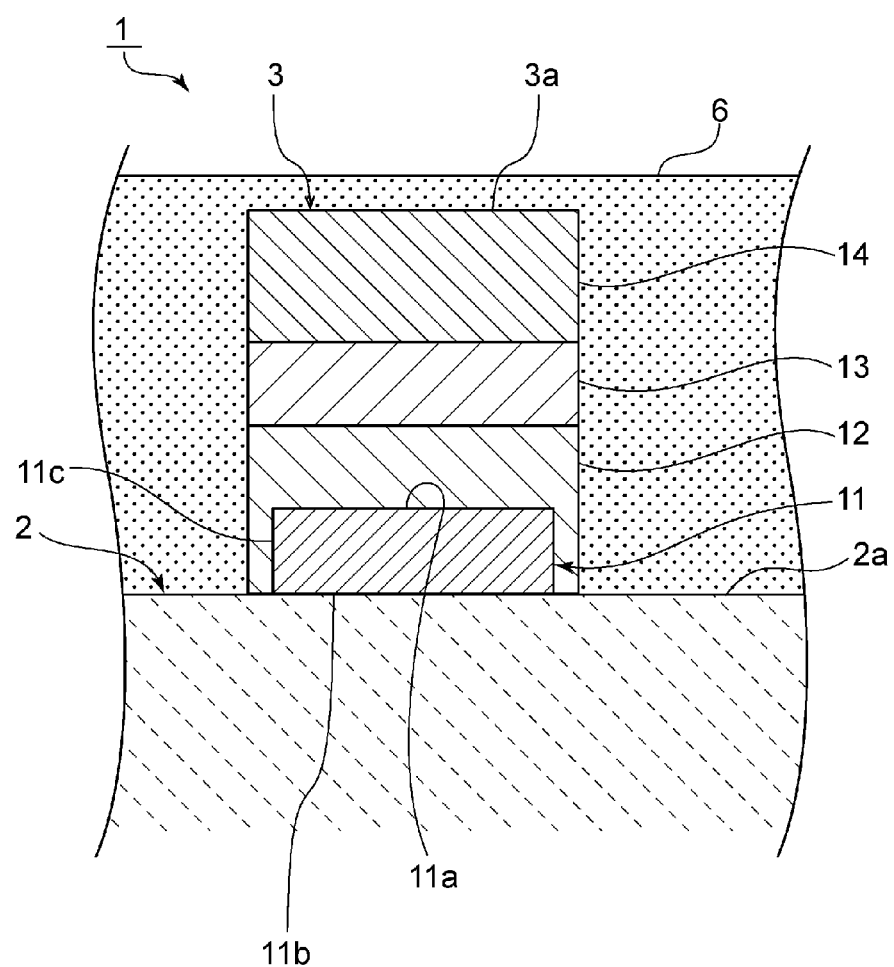
FIG. 1 is a partially cutaway enlarged elevational cross-sectional view of a main portion of an elastic wave device according to a first preferred embodiment of the present invention.

FIG. 1 is a partially cutaway enlarged elevational cross-sectional view of a main portion of the elastic wave device 1 illustrated in FIG. 2 and corresponds to a portion where an electrode finger 3a is disposed in FIG. 2.

As illustrated in FIG. 1, the IDT electrode 3 has a structure in which a plurality of electrode layers are stacked. A close contact layer 11, a first electrode layer 12, a diffusion preventing layer 13 defining a fourth electrode layer, and a second electrode layer 14 are stacked in this order from the piezoelectric substrate 2. In the present preferred embodiment, the close contact layer 11 is preferably made of NiCr, for example. The first electrode layer 12 is preferably made of Pt, for example, and is disposed directly on the close contact layer 11. The diffusion preventing layer 13 is preferably made of Ti, for example. The second electrode layer 14 is preferably made of Al, for example.

The elastic wave device 1 preferably utilizes a Rayleigh wave that propagates along the piezoelectric substrate 2 made of $LiNbO_3$. To sufficiently increase a response of the Rayleigh wave, the first electrode layer 12 made of Pt, which has a higher density than Al, is used in the IDT electrode 3. To improve the adhesion of the IDT electrode 3 to the piezoelectric substrate 2, the close contact layer 11 made of NiCr is used. Because of having such a function, the close contact layer 11 is an electrode layer in contact with the piezoelectric substrate 2. The close contact layer 11 includes a first main surface 11a, a second main surface 11b, and side surfaces 11c. The close contact layer 11 is disposed on the piezoelectric substrate 2 such that the second main surface 11b is in contact with the piezoelectric substrate 2.

By using the second electrode layer 14 made of Al, which has a higher electrical conductivity than the first electrode layer 12 made of Pt, loss is reduced. To prevent metal diffusion between the first electrode layer 12 made of Pt and the second electrode layer 14 made of Al, the diffusion preventing layer 13 is disposed.

As described above, the NiCr close contact layer of existing elastic wave devices does not have sufficient weather resistance. In the present preferred embodiment, as illustrated in FIG. 1, the first electrode layer 12 covers not only the first main surface 11a of the close contact layer 11, but also the side surfaces 11c. The first electrode layer 12 is preferably made of a metal or an alloy having higher weather resistance than that of a metal or an alloy of the close contact layer 11. Herein, having higher weather resistance means that a metal has a relatively low ionization tendency or that a metal has improved corrosion resistance due to metal passivation. In a case in which an alloy is used, the ionization tendency of each metal of the alloy may be used as a basis. For example, comparing NiCr and Pt with each other, Pt has a lower ionization tendency than Ni and Cr, and consequently, Pt has higher weather resistance than NiCr. Ti has a higher ionization tendency than NiCr. However, passivation of Ti, which refers to the formation of an oxide film to protect against corrosion, occurs on the surface of Ti, and as a result, Ti has higher weather resistance than NiCr.

In the elastic wave device 1, weather resistance is improved because the close contact layer 11 is covered by the first electrode layer 12 having high weather resistance. In more detail, even if moisture in the air passes through the dielectric layer 6, NiCr is unlikely to corrode, and as a result, the weather resistance of the elastic wave device 1 is effectively improved. Therefore, characteristics of the elastic wave device 1 are unlikely to degrade.

Although each of the electrode layers of the IDT electrode 3 in the elastic wave device 1 may be formed by any method and may have any film thickness, each of the electrode layers is preferably formed by vacuum deposition, for example, in the present preferred embodiment. As a result, the IDT electrode 3 is easily obtained.

In a case in which the IDT electrode 3 is formed by vacuum deposition, when a Pt film for the first electrode layer 12, which is a second layer, is formed, gas is introduced into a chamber to decrease the degree of vacuum. This reduces the vertical incidence of deposition particles. Therefore, the deposition particles of Pt circulate and adhere to the side surfaces 11c of the close contact layer 11 made of NiCr, which is a lower layer. As a result, the first electrode layer 12 made of Pt is able to be formed so as to cover the side surfaces 11c of the close contact layer 11.

As the gas introduced into the chamber, Ar may be suitably used. When a Ti film defining the diffusion preventing layer 13 and an Al film defining the second electrode layer 14 are formed, the degree of vacuum in the chamber is further increased. This increases the vertical incidence of the deposition particles. As a result, the diffusion preventing layer 13 and the second electrode layer 14 are able to be formed as illustrated in FIG. 1.

The thickness of each layer of the IDT electrode 3 is not particularly limited. However, the thickness of Al, Ti, Pt, and NiCr in the present preferred embodiment is preferably, for example, about 150 nm, about 10 nm, about 80 nm, and about 10 nm, respectively. Preferably, the first electrode layer 12 made of Pt has a sufficient thickness in order to apply a sufficient mass to the piezoelectric substrate 2 so as to increase the reflection coefficient of the Rayleigh wave. The thickness of the second electrode layer 14 made of Al is preferably about 150 nm, for example, which is also relatively thick. This sufficiently increases electrical conductivity and, therefore, decreases loss. The thickness of the diffusion preventing layer 13 is preferably less than the thickness of the first electrode layer 12 and the second electrode layer 14 because the diffusion preventing layer 13 is disposed in order to prevent mutual diffusion. The thickness of the close contact layer 11 is also preferably less than the thickness of the first electrode layer 12 and the second electrode layer 14 because the close contact layer 11 is disposed in order to increase adhesion. The reason is described as follows. The absolute value of the temperature coefficient of resonant frequency TCF decreases with a decreasing ratio of thickness of the overall electrode to the thickness of the dielectric layer $SiO_2$. Therefore, electrode layers made of materials other than Pt and Al are preferably thin so that the electrical characteristics are compatible with the temperature coefficient of resonant frequency TCF.

Accordingly, the thickness of the close contact layer is preferably less than the thickness of Pt and Al.

In the present preferred embodiment, preferably, the first electrode layer 12 is made of Pt and disposed directly on the close contact layer 11 made of NiCr. Mutual diffusion is unlikely to occur between Pt and NiCr. Therefore, any undesirable effects due to mutual diffusion are unlikely to occur.

Since the close contact layer 11 made of NiCr is covered by the first electrode layer 12, materials used for the electrode layers disposed above the first electrode layer 12, such as the diffusion preventing layer 13 and the second electrode layer 14, may be selected without considering mutual diffusion with NiCr.

The close contact layer 11 may be made of Ti instead of NiCr. In other words, metal of the close contact layer may be any appropriate metal provided that adhesion of the metal to the piezoelectric substrate is higher than the adhesion of the first electrode layer 12. Examples of such metals include NiCr and Ti, and NiCr is preferable.

To sufficiently increase a response of the Rayleigh wave, the first electrode layer 12 is preferably made of a metal having a higher density than that of Al. Examples of such a metal having a higher density than that of Al include Pt, Cu, Au, and Mo. The first electrode layer 12 is preferably made of one selected from the group consisting of Pt, Cu, Au, and Mo, for example. This sufficiently increases the response of the Rayleigh wave.

The diffusion preventing layer 13 defining the fourth electrode layer, which is not essential, is made of an appropriate metal that is able to prevent metal diffusion between electrode layers disposed on both sides of the diffusion preventing layer 13. As such metals and metal compounds, Ti, TiN, and $TiO_x$, for example, may be suitably used. When the first electrode layer 12 is made of Au, the second electrode layer 14 may be made of Al, which has a higher electrical resistance than Au.

As described above, the combination of materials used for the close contact layer, the first electrode layer, and the second electrode layer is not particularly limited. For example, in the first preferred embodiment, the following combinations of the materials, from the opposite side of the piezoelectric substrate, may be suitably used AlCu or Au/Pt, Cu, Au, or Mo/NiCr; or AlCu or Al/Pt or Au/Ti.

In the first preferred embodiment, vacuum deposition is preferably used to form each metal film of the IDT electrode 3. However, another deposition method, such as sputtering, may be used.

Figure 3:
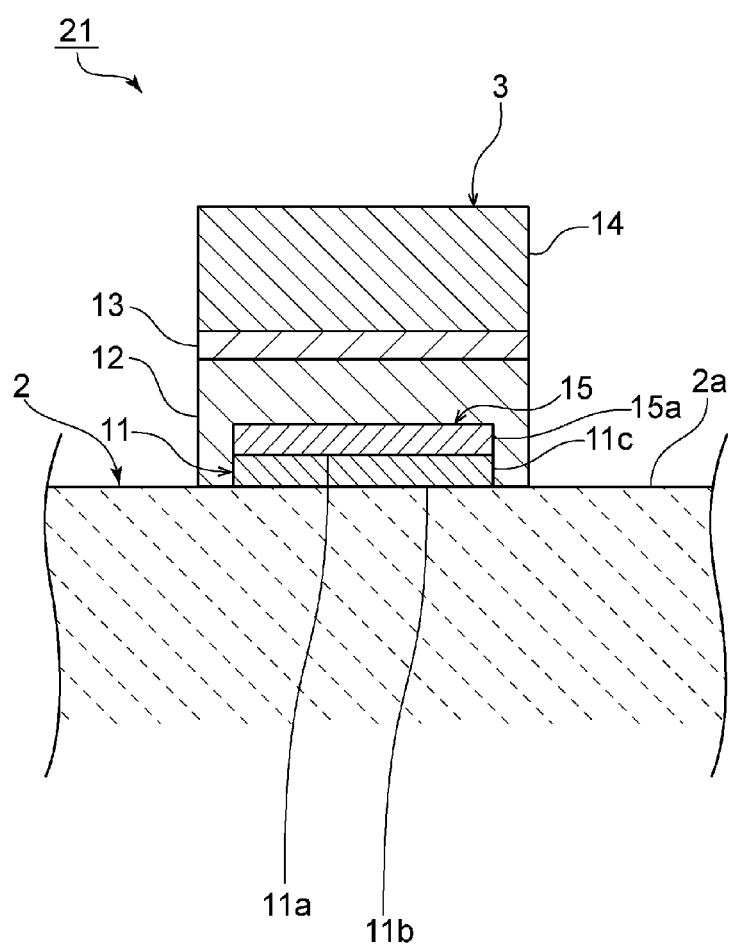
FIG. 3 is a partially cutaway enlarged elevational cross-sectional view of a main portion of an elastic wave device according to a second preferred embodiment of the present invention.

FIG. 3 is a partially cutaway enlarged elevational cross-sectional view of a main portion of an elastic wave device according to a second preferred embodiment of the present invention. An elastic wave device 21 in the second preferred embodiment has the same or substantially the same structure as that of the elastic wave device 1, except that the elastic wave device 21 does not include the dielectric layer 6 and includes a third electrode layer 15 on the close contact layer 11.

The dielectric layer 6 may be omitted as in the elastic wave device 21. The reason is that the absence of the dielectric layer 6 leads to an increased electromechanical coupling coefficient and a broadened pass band of the elastic wave device.

In this case, the moisture in the air may directly contact the IDT electrode 3. However, the side surfaces 11c of the close contact layer 11 are covered by the first electrode layer 12. Therefore, the weather resistance of the elastic wave device 21 is effectively improved.

As in the present preferred embodiment, the first electrode layer 12 may be indirectly disposed on the close contact layer 11 with the third electrode layer 15 interposed therebetween. The third electrode layer 15 is preferably made of Ti, for example. This is because, by disposing the third electrode layer 15 made of Ti on the close contact layer 11, the crystal orientation of the electrode layer directly on the third electrode layer 15 is increased, and as a result, the electric power handling capability of the elastic wave device is improved.

Side surfaces 15*a* of the third electrode layer 15 made of Ti and the side surfaces 11*c* of the close contact layer 11 are covered by the first electrode layer 12.

As in the elastic wave device 21, the side surfaces 11*c* of the close contact layer 11 may be covered not by the third electrode layer 15 located directly on the close contact layer 11, but by the first electrode layer 12 that is located above the third electrode layer 15.

As in the first preferred embodiment, the first electrode layer 12 is preferably made of Pt, for example, which has a lower ionization tendency than NiCr and Ti, and thus has excellent weather resistance. Therefore, the weather resistance of the IDT electrode 3 is effectively improved.

Figure 4:
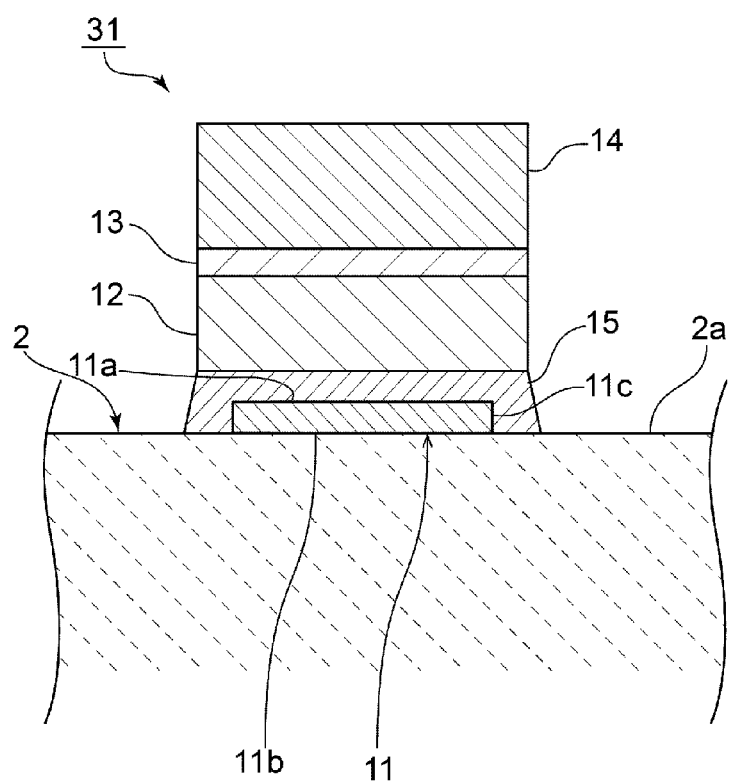
FIG. 4 is a partially cutaway enlarged elevational cross-sectional view of a main portion of an elastic wave device according to a third preferred embodiment of the present invention.

FIG. 4 is a partially cutaway enlarged elevational cross-sectional view of a main portion of an elastic wave device according to a third preferred embodiment of the present invention. In an elastic wave device 31, preferably, the side surfaces 11*c* of the close contact layer 11 preferably made of NiCr are covered by the third electrode layer 15 made of Ti. In other words, the side surfaces 11*c* of the close contact layer 11 are covered by the third electrode layer 15 disposed directly on the close contact layer 11. The side surfaces of the third electrode layer 15 are inclined so as to get closer to a center of the third electrode layer 15 from a close-contact-layer-11 side towards a second-electrode-layer-14 side. In this case, passivation of Ti, which refers to the formation of an oxide film to protect against corrosion, occurs on the surface of Ti, and as a result, the Ti has higher weather resistance than NiCr. Therefore, the weather resistance is also effectively increased in the third preferred embodiment.

Figure 5:
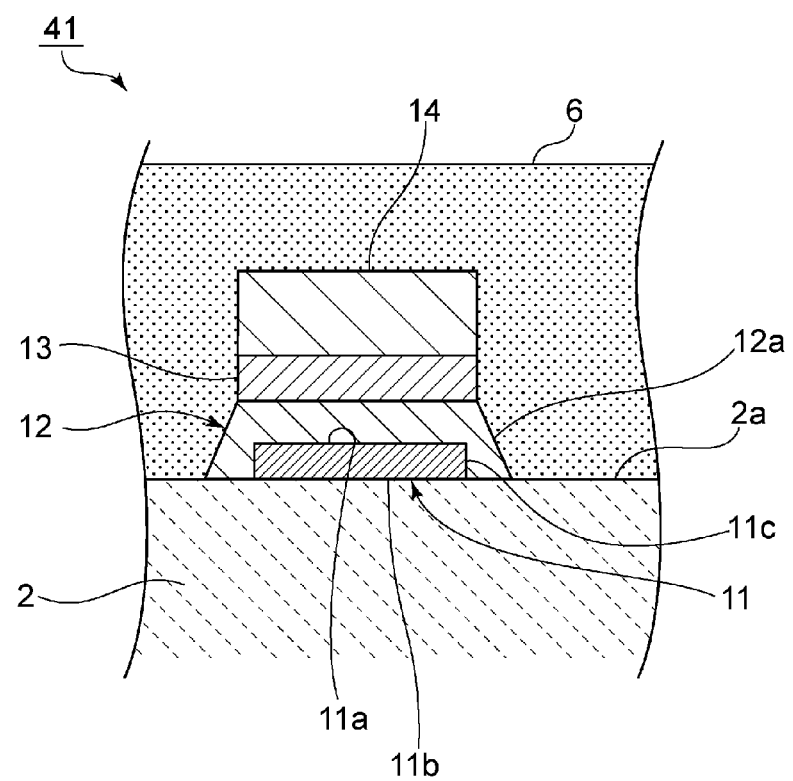
FIG. 5 is a partially cutaway enlarged elevational cross-sectional view of a main portion of an elastic wave device according to a fourth preferred embodiment of the present invention.

FIG. 5 is a partially cutaway enlarged elevational cross-sectional view of a main portion of an elastic wave device according to a fourth preferred embodiment of the present invention. In an elastic wave device 41, the first electrode layer 12 is tapered. In other words, side surfaces 12*a* of the first electrode layer 12 are inclined so as to get closer to the center of the first electrode layer 12 from the close-contact-layer-11 side towards the second-electrode-layer-14 side, that is, towards the upper portion in FIG. 5. Except for this, the elastic wave device 41 is the same or substantially the same as the elastic wave device 1.

As in the present preferred embodiment, when the first electrode layer 12 is tapered, a space is unlikely to occur between the dielectric layer 6 and the first electrode layer 12 when forming the dielectric layer 6 by a deposition method, such as sputtering, for example. Therefore, the weather resistance is effectively improved.

Except for this structure, the elastic wave device 41 has the same or substantially the same structure as that of the elastic wave device 1, and as a result, the elastic wave device 41 has the same or similar effects and advantages as those of the elastic wave device 1.

Figure 6:
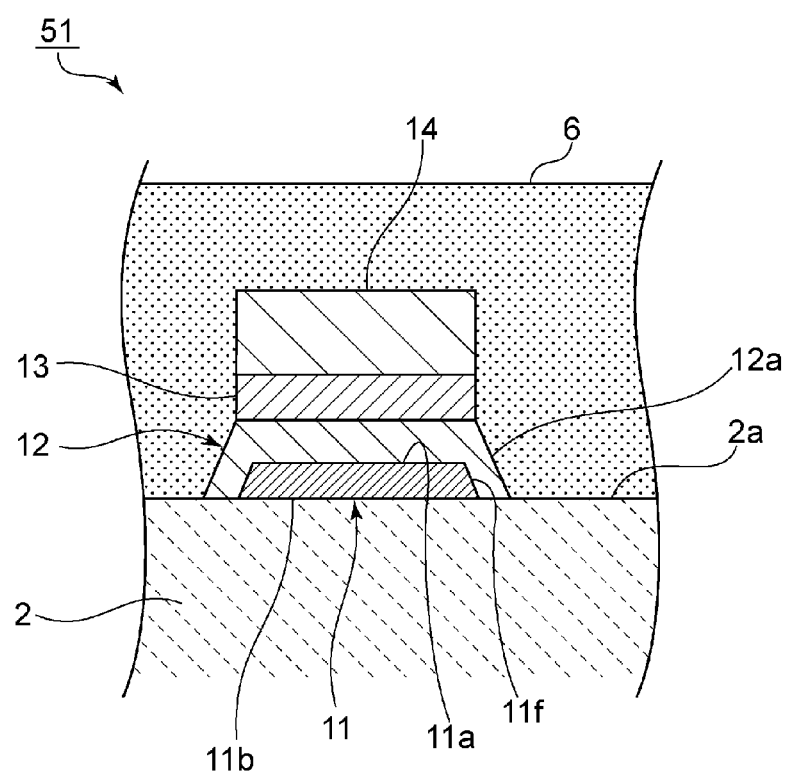
FIG. 6 is a partially cutaway enlarged elevational cross-sectional view of a main portion of an elastic wave device according to a fifth preferred embodiment of the present invention.

FIG. 6 is a partially cutaway enlarged elevational cross-sectional view of a main portion of an elastic wave device according to a fifth preferred embodiment of the present invention.

In an elastic wave device 51, the close contact layer 11 is tapered. In other words, side surfaces 11*f* of the close contact layer 11 are inclined so as to get closer to the center of the close contact layer 11 from the piezoelectric-substrate-2 side towards the first-electrode-layer-12 side, that is, towards the upper portion. The side surfaces 11*f* of the close contact layer 11 be inclined, and the close contact layer 11 may be tapered. In this case, the first electrode layer 12 is able to be easily formed so as to reliably cover the side surfaces 11*f* of the close contact layer 11. In this case, furthermore, the first electrode layer 12 covering the side surfaces 11*f* includes the side surfaces 12*a*, which are also preferably inclined. Therefore, as in the elastic wave device 41, a space is unlikely to occur between the dielectric layer 6 and the first electrode layer 12.

Except for this structure, the elastic wave device 51 has the same or substantially the same structure as that of the elastic wave device 1, and as a result, the elastic wave device 51 has the same or similar effects and advantages as those of the elastic wave device 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate that includes a first main surface and a second main surface; and
   an IDT electrode that is disposed on the piezoelectric substrate; wherein
   the IDT electrode includes:
     a close contact layer disposed in contact with the first main surface of the piezoelectric substrate; and
     at least two electrode layers disposed on the close contact layer;
   the at least two electrode layers include:
     a first electrode layer that is disposed on the close contact layer and has a higher density than that of Al; and
     a second electrode layer that is disposed on the first electrode layer and has a lower density than that of the first electrode layer;
   one of the at least two electrode layers has a higher weather resistance than the close contact layer and covers side surfaces of the close contact layer;
   the first electrode layer is disposed directly on at least a portion of the close contact layer; and
   of the at least two electrode layers, only the one of the at least two electrode layers covers the side surfaces of the close contact layer.

2. The elastic wave device according to claim 1, wherein the first electrode layer covers the side surfaces of the close contact layer.

3. The elastic wave device according to claim 2, wherein
   the IDT electrode includes a third electrode layer disposed between the close contact layer and the first electrode layer; and
   the first electrode layer covers the side surfaces of the close contact layer and side surfaces of the third electrode layer.

4. The elastic wave device according to claim 1, wherein
   the IDT electrode includes a third electrode layer disposed between the close contact layer and the first electrode layer; and the third electrode layer covers the side surfaces of the close contact layer.

5. The elastic wave device according to claim 1, wherein side surfaces of the first electrode layer are inclined so as to get closer to a center of the first electrode layer from a close-contact-layer side towards a second-electrode-layer side.

6. The elastic wave device according to claim 4, wherein side surfaces of the third electrode layer are inclined so as to get closer to a center of the third electrode layer from a close-contact-layer side towards a second-electrode-layer side.

7. The elastic wave device according to claim 1, further comprising a dielectric layer disposed on the piezoelectric substrate so as to cover the IDT electrode.

8. The elastic wave device according to claim 1, wherein the side surfaces of the close contact layer are inclined so as to get closer to a center of the close contact layer from the piezoelectric substrate towards an electrode-layer side, and the one of the at least two electrode layers covers the side surfaces of the close contact layer.

9. The elastic wave device according to claim 1, wherein the close contact layer is thinner than the first and second electrode layers.

10. The elastic wave device according to claim 1, further comprising a diffusion preventing layer that is disposed between the first electrode layer and the second electrode layer and prevents metal diffusion between the first electrode layer and the second electrode layer.

11. The elastic wave device according to claim 10, wherein the diffusion preventing layer is thinner than the first and second electrode layers.

12. The elastic wave device according to claim 7, wherein the dielectric layer is made of silicon oxide.

13. The elastic wave device according to claim 1, wherein the close contact layer includes a metal layer made of NiCr or Ti.

14. The elastic wave device according to claim 1, wherein the second electrode layer is made of Al or an Al alloy.

15. The elastic wave device according to claim 1, wherein the first electrode layer is made of a single metal selected from the group consisting of Pt, Cu, Au, and Mo or an alloy including the single metal as a main component.

16. The elastic wave device according to claim 1, wherein the higher weather resistance is defined as a lower ionization tendency or a greater corrosion resistance due to metal passivation.

17. The elastic wave device according to claim 8, wherein side surfaces of the one of the at least two electrode layers covering the side surfaces of the close contact layer are inclined so as to get closer to a center of the one of the at least two electrode layers from a close-contact-layer side towards a side opposite to the close-contact-layer side.

* * * * *